(12) United States Patent
McAllister et al.

(10) Patent No.: US 7,834,311 B2
(45) Date of Patent: Nov. 16, 2010

(54) LENS ASSEMBLY WITH A ROTATABLE ADJUSTABLE MEMBER FOR DISCRETELY VARYING POSITION OF A MOUNTING MEMBER

(75) Inventors: Iain McAllister, Edinburgh (GB); Eric Christison, Edinburgh (GB)

(73) Assignee: STMicroelectronics (Research & Development) Limited, Marlow-Buckinghamshire (GB)

( * ) Notice: Subject to any disclaimer, the term of this patent is extended or adjusted under 35 U.S.C. 154(b) by 427 days.

(21) Appl. No.: 11/946,441

(22) Filed: Nov. 28, 2007

(65) Prior Publication Data

US 2008/0170151 A1    Jul. 17, 2008

(30) Foreign Application Priority Data

Jan. 11, 2007    (EP)    ................................... 07000559

(51) Int. Cl.
    *H01J 5/02*    (2006.01)
(52) U.S. Cl. .................................... 250/239; 250/208.1
(58) Field of Classification Search ............. 250/208.1, 250/239, 216, 201.2–201.5; 438/430, 25, 438/29; 359/819, 704, 703, 694; 396/72–83
    See application file for complete search history.

(56) References Cited

U.S. PATENT DOCUMENTS

| | | | |
|---|---|---|---|
| 4,769,711 A | | 9/1988 | Date ........................... 358/229 |
| 4,946,255 A | * | 8/1990 | Mizoguchi et al. .......... 359/823 |
| 6,686,588 B1 | * | 2/2004 | Webster et al. .............. 250/239 |
| 2003/0137595 A1 | | 7/2003 | Takachi ....................... 348/340 |

FOREIGN PATENT DOCUMENTS

| | | |
|---|---|---|
| DE | 20017490 | 12/2000 |
| JP | 2002303776 | 10/2002 |
| WO | 2005031422 | 4/2005 |

* cited by examiner

*Primary Examiner*—Que T Le
(74) *Attorney, Agent, or Firm*—Lisa K. Jorgenson; Allen, Dyer, Doppelt, Milbrath & Gilchrist, P.A.

(57) ABSTRACT

A lens assembly for an imaging device includes a lens for focusing external radiation towards an image sensor of the imaging device. A mounting member is between the lens and the image sensor so that the lens is spaced a set distance from the image sensor. An adjustment member varies position of the mounting member relative to the image sensor so that the set distance is varied.

20 Claims, 3 Drawing Sheets

LENS ASSEMBLY WITH A ROTATABLE ADJUSTABLE MEMBER FOR DISCRETELY VARYING POSITION OF A MOUNTING MEMBER

FIELD OF THE INVENTION

The present invention relates to a lens assembly for an imaging device. In particular, but not exclusively, the invention relates to a lens assembly for an imaging device that includes a solid-state image sensor.

BACKGROUND OF THE INVENTION

Imaging devices including solid-state image sensors are increasingly being incorporated into handheld devices, such as cameras, mobile cellular telephones and personal digital assistants. A primary design objective is to minimize or reduce the space utilized by the imaging device. Another is to minimize or reduce the cost of the imaging device, and the cost of manufacturing and testing of the imaging device. One reason for these design objectives is that the camera unit provided by the imaging device is often secondary to the main function of the handheld device, such as a mobile telephone.

The imaging device includes an image sensor which comprises a sensor chip and its packaging. The sensor chip has a sensor array formed on a top surface of a die. For protective packaging, the sensor chip is sandwiched between two transparent sheets, typically formed from glass.

The image sensor requires a focussing lens for reproducing an image of the subject. The lens may be a single lens element or a compound lens formed by two or more elements. The lens may be formed from glass or a transparent plastic material or any other material with adequate transparency. The distance from the rear surface of the lens to the image sensor is termed the back focal length.

In conventional imaging devices, the lens is mounted within a support structure commonly referred to as a barrel. The barrel is coupled to a mount that is fixably attached to the top surface of the image sensor, which is the top surface of the upper transparent sheet of the packaging. The lens, barrel and mount are usually made from low cost materials such as plastic.

For variable focus systems (such as autofocus), the barrel, and thus the lens, are movable relative to the mount, and thus the image sensor. The mount is fixed relative to the image sensor. Autofocus systems are more expensive since they require additional components and additional manufacturing and testing steps. They are also relatively large and heavy, and consume relatively large amounts of power.

In many applications, it is acceptable to use a no focus system. In such a case, the barrel and thus the lens, is typically fixed relative to the mount (during initial assembly and testing). The mount is still fixed relative to the image sensor.

The accuracy (allowable tolerance) of positioning of the lens relative to the sensor array of the image sensor depends on the application, but typically is in the range of $\pm 2\text{-}100$ μm for an acceptable image quality. However, variation in the distance between the lens and the sensor array can arise from a number of sources. There can be variation in the positioning of the lens in the barrel, of the barrel to the mount, of the mount to the image sensor (the thickness of the adhesive used), and of the sensor array within its packaging. There can be manufacturing variations in the lens shape, the height of the mount, and the thickness of the surface of the upper sheet of the packaging.

In known no focus systems, the barrel is typically threadably fastened to the mount. During an assembly and testing stage, the barrel can be rotated a little within the mount to move the barrel closer to or further from the image sensor. This is continued until the image being obtained is deemed to be optimal. The distance between the lens and the image sensor is therefore infinitely variable. However, this approach has drawbacks. First, rotating the barrel within the mount can dislodge foreign material within the threads, and this material can fall onto the sensor array to degrade image quality. Secondly, the infinite variability and subjective assessment of the optimum position significantly increases the testing time for an individual imaging device.

SUMMARY OF THE INVENTION

In view of the foregoing background, an object of the present invention is to provide an imaging device which allows for adjusting the back focal length, at least within the allowable tolerance of the system, but which does not require additional components and additional manufacturing and testing steps as with conventional variable focus systems.

Another object of the present invention is to provide an imaging device in which the adjustment does not involve moving the barrel relative to the mount to avoid dislodging foreign material.

Yet another object of the present invention is to reduce the assembly and testing time associated with an individual imaging device.

According to a first aspect, a lens assembly for an imaging device comprises a lens member for focusing external radiation towards an image sensor of the imaging device, and a mounting member interposes the lens member and the image sensor such that the lens member is spaced apart from the image sensor by a distance. Adjustment means or an adjustment member may be adapted to vary the position of the mounting member relative to the image sensor such that the distance is varied.

The adjustment member may comprise one or more formations interposing the mounting member and the image sensor. The adjustment member may comprise a first formation provided at one of the mounting members and the image sensor.

The lens assembly may include a connecting member interposing the mounting member and the image sensor, and the adjustment member may comprise a plurality of fixing or set positions provided at the connecting member. Each fixing position represents a different distance between the lens and the image sensor.

The first formation may be removably attached to the mounting member or image sensor. The adjustment member may comprise a plurality of interchangeable formations, each being a different size, to vary the position of the mounting member relative to the image sensor. The interchangeable formations may be combinable with each other to provide a greater number of possible variations.

The first formation may be provided at the image sensor, and the adjustment member may further comprise a second formation at the mounting member. The first and second formations may cooperate to provide the adjustment member.

One or both of the first and second formations may comprise a spacing element. Alternatively or in addition, one or both of the first and second formations may include an aperture or recess.

The first formation may engage with the second formation when the mounting member is at a first orientation relative to the image sensor. The first formation may not engage with the second formation when the mounting member is at a second orientation relative to the image sensor. The term "engages with" may be intended to include insertion of a spacing element within an aperture or recess or simply an abutting relationship between two spacing elements.

The adjustment member may be adapted to vary the position of the mounting member relative to the image sensor such that the distance is varied in discrete steps. The adjustment member may be adapted to provide one discrete variation to the distance. The adjustment member may comprise a third or more formations. The adjustment member may be adapted to provide a plurality of discrete variations to the distance.

The plurality of discrete variations to the distance may be provided by a plurality of orientations of the mounting member relative to the image sensor. Alternatively or in addition, the third or more formations may comprise a spacing element that is thicker than one or both of the first and second spacing elements. Alternatively or in addition, the third or more formations may comprise a recess that is deeper than one or both of the first and second recesses.

The lens assembly may include a lens holder connectable to the mounting member. The image sensor may comprise one of the following: a solid-state image sensor, a CMOS image sensor, a chip scale package and a ball grid array.

According to a second aspect, a method of assembling a lens assembly for an imaging device may comprise providing an image sensor and a lens member for focusing external radiation towards the image sensor, interposing a mounting member between the lens member and the image sensor such that the lens member is spaced apart from the image sensor by a distance, and varying the position of the mounting member relative to the image sensor using an adjustment member such that the distance is varied.

The adjustment member may comprise one or more formations interposing the mounting member and the image sensor. The adjustment member may comprise a first formation provided at one of the mounting members and the image sensor.

The method may include interchanging a plurality of formations, with each being a different size, to vary the position of the mounting member relative to the image sensor. The method may include combining formations of different sizes with each other to provide a greater number of possible variations.

The method may include using a plurality of object planes at variable distances from the imaging device during testing. This allows the optimal focal position to be known instantly.

The method may include providing a first formation at the image sensor and a second formation at the mounting member. The first and second formations may cooperate to provide the adjustment member.

The method may include arranging the first and second formations such that the first formation engages with the second formation when the mounting member is at a first orientation relative to the image sensor, and the first formation does not engage with the second formation when the mounting member is at a second orientation relative to the image sensor.

The method may include varying the position of the mounting member relative to the image sensor such that the distance is varied in discrete steps.

The adjustment member may comprise a third or more formations. The adjustment member may be adapted to provide a plurality of discrete variations to the distance. The plurality of discrete variations to the distance may be provided by a plurality of orientations of the mounting member relative to the image sensor.

An imaging device may comprise a lens assembly as discussed above. A camera may comprise a lens assembly as discussed above. A mobile electronic device, such as a mobile telephone or a PDA, may comprise a lens assembly as discussed above.

BRIEF DESCRIPTION OF THE DRAWINGS

An embodiment of the invention will now be described, by way of example only, with reference to the drawings, in which.

DETAILED DESCRIPTION OF THE PREFERRED EMBODIMENTS

Figure 1:
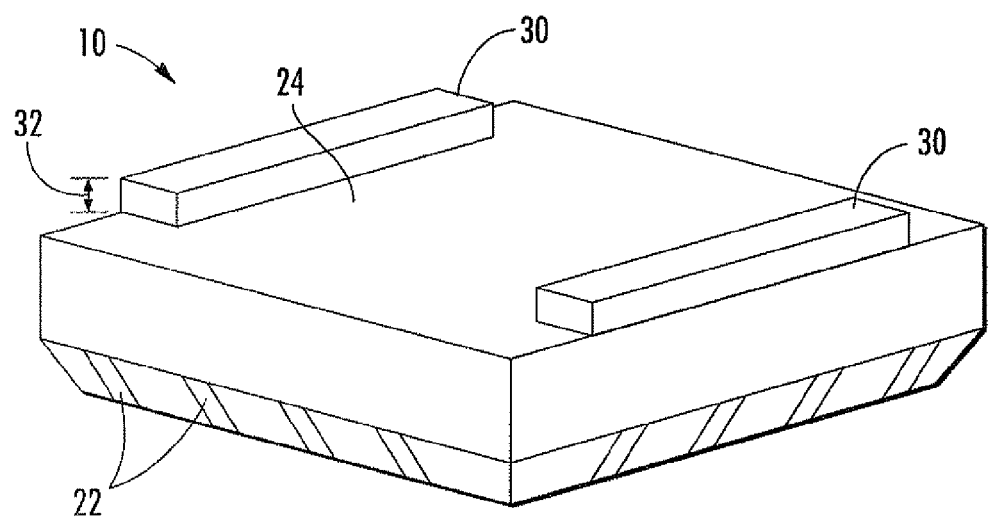
FIG. 1 is a perspective view of an image sensor including a first formation of the invention.
Figure 2:
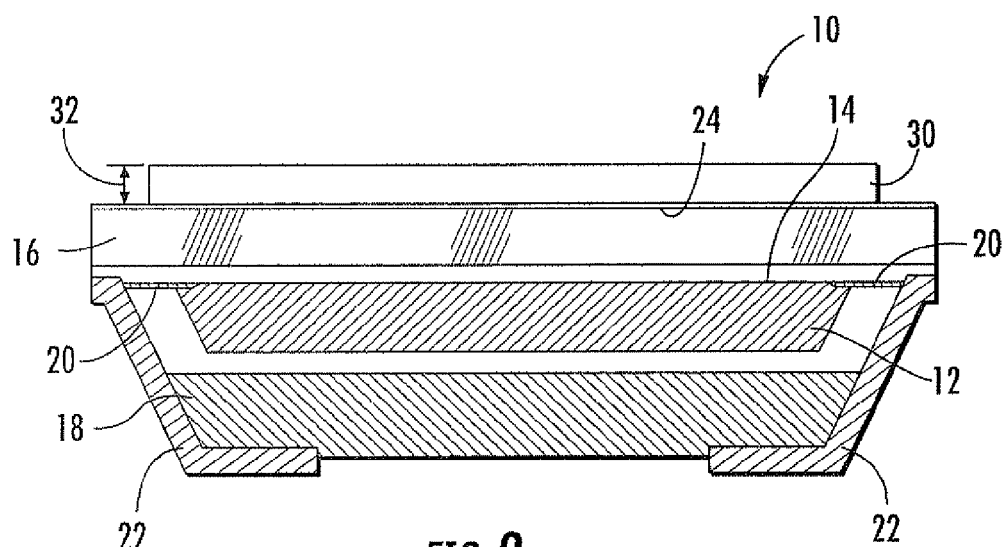
FIG. 2 is a side view of the image sensor and the first formation of FIG. 1.

FIGS. 1 and 2 show an image sensor 10 comprising a sensor chip 12 having a sensor array (not shown) formed on a top surface 14 of a die. The image sensor 10 includes protective packaging in the form of an upper 16 and lower 18 glass sheet. A number of electrical contact pads 20 are arranged around the periphery of the top surface 14 of the sensor chip 12. A corresponding number of electrical tracks 22 are connected to the pads 20, and extend around the sides of the packaging to the lower surface of the lower glass sheet 18.

A first formation of adjustment means or an adjustment member is provided on the upper surface 24 of the upper glass sheet 16. This is in the form of two spacing elements 30, each provided near an edge of the upper glass sheet 16. Each spacing element 30 extends in a longitudinal direction but does not extend as far as the two remaining edges of the upper glass sheet 16. Each spacing element 30 has a height 32 in the range of 1 to 100 μm.

Figure 3:
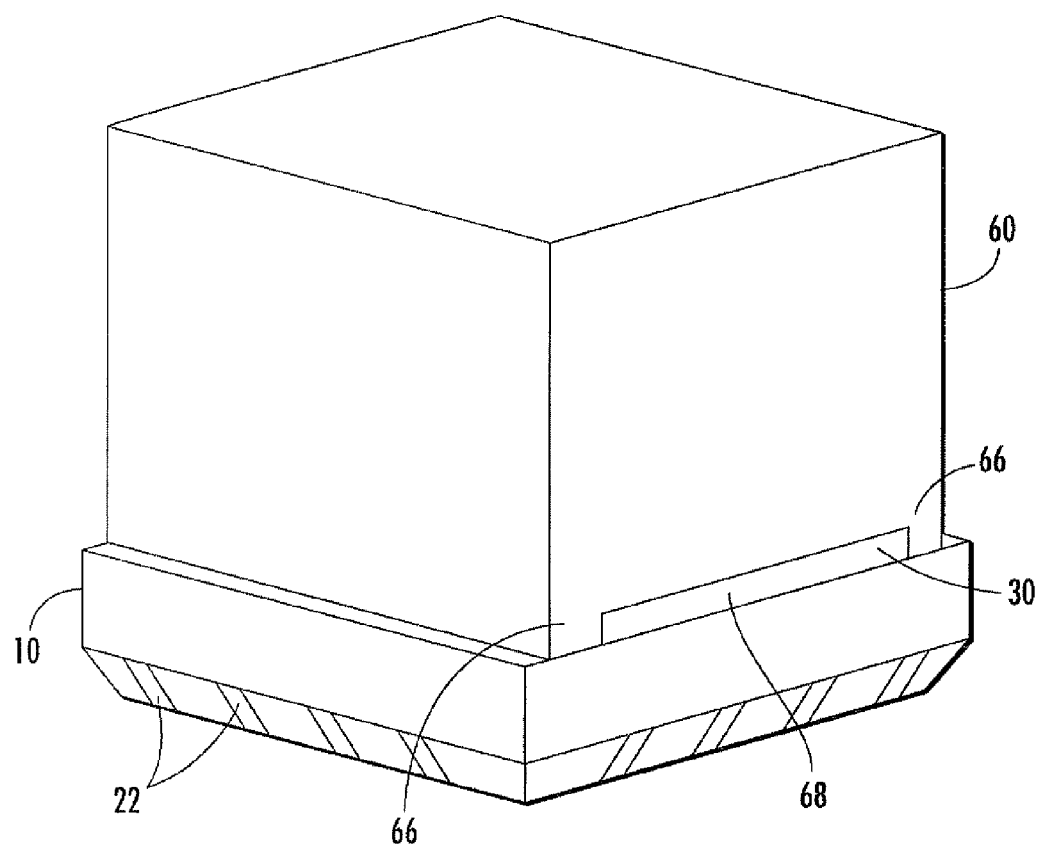
FIG. 3 is a sectional side view of the image sensor and a lens assembly according to the invention with the mounting member at a first orientation.
Figure 4:
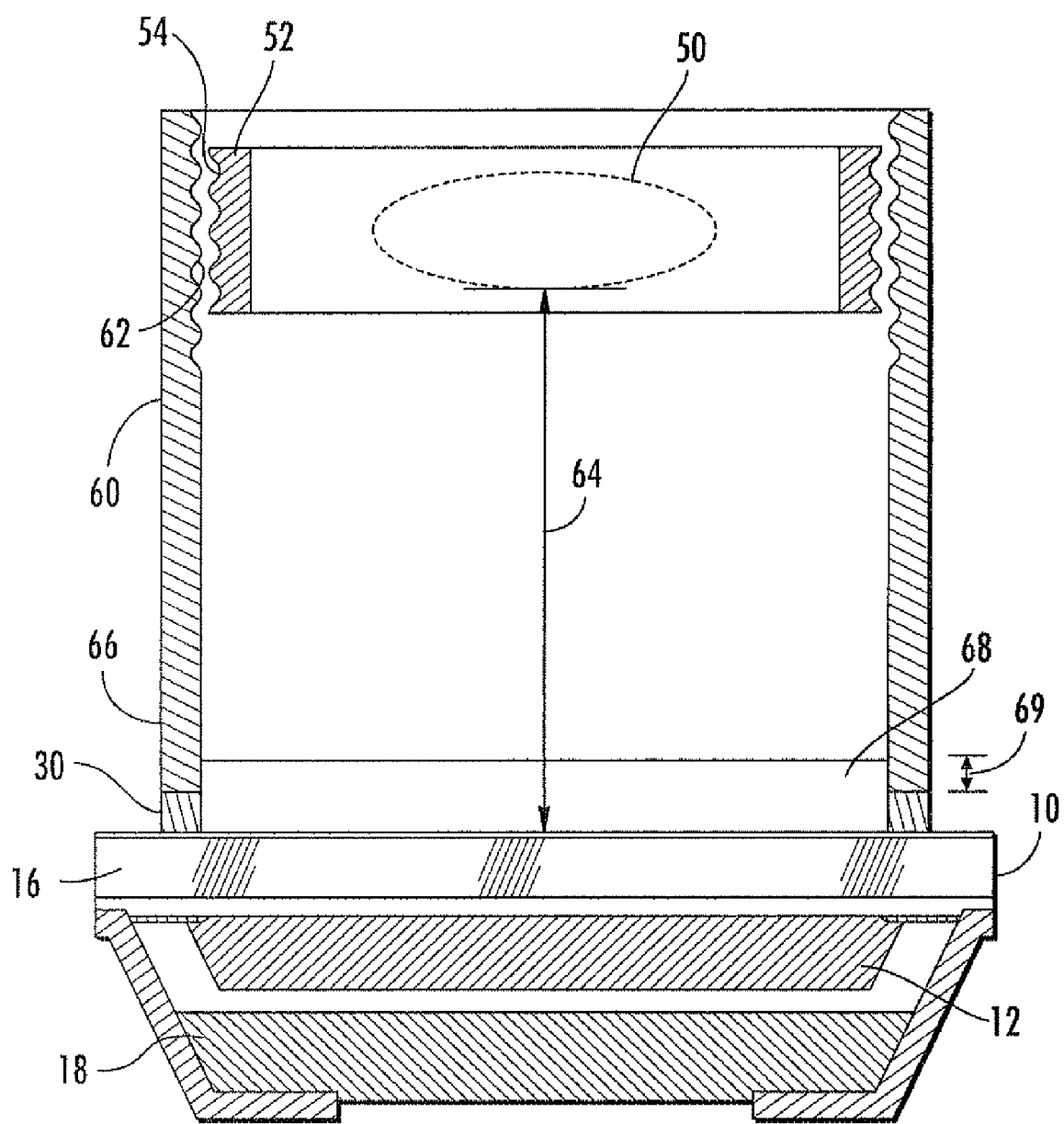
FIG. 4 is a perspective view of the image sensor and lens assembly according to the invention with the mounting member at a second orientation.

FIGS. 3 and 4 show a lens assembly coupled to the image sensor 10. The lens assembly includes a lens 50 for focusing light towards the image sensor 10. The lens 50 is mounted within a barrel 52. The barrel 52 includes a thread 54 and is fastened to the thread 62 of a mount 60. The mount 60 is fixed to the top surface 24 of the upper sheet 16 of the image sensor 10. The mount 60 therefore interposes the lens 50 and the image sensor 10 such that the lens is spaced apart from the image sensor by a certain distance 64.

The adjustment member also includes a second formation provided at the mount 60. The second formation also comprises two spacing elements 66, which in this embodiment are integrally formed with the mount 60. Each spacing element 66 extends in a longitudinal direction as far as the two edges of the upper glass sheet 16. The body of the mount 60 and the spacing elements 66 define a recess 68. Each spacing element 66 has a height 69 in the range of 1 to 100 μm.

In FIG. 3, the mount 60 is at a first orientation relative to the image sensor 10. At this first orientation, the spacing elements 30 are contained within the recess 68. Therefore, the spacing elements 66 are in direct contact with the top surface 24 of the image sensor 10.

The lens assembly is designed such that the distance 64 between the lens 50 and the image sensor 10 is the nominal back focal length. However, due to various sources of error, the distance 64 may be less than the actual back focal length. In which case, the mount 60 can be rotated by 90° so that the mount, specifically the spacing elements 66, are supported by the spacing elements 30. The mount 60 is therefore raised by the height 32 of the spacing elements 30. In this way, the first and second formations cooperate to provide the adjustment member that can vary the position of the mounting member relative to the image sensor such that the distance 64 is varied.

The distance 64 is varied in one discrete step. At the testing and assembly stage, the assembler has only two options for mounting the mount 60 to the image sensor 10. This substantially reduces the assembly and testing time associated with an individual imaging device. Also, at this stage, there is no need to move the barrel 52 relative to the mount 60 and so foreign material will not be dislodged.

Various modifications and improvements can be made without departing from the scope of the present invention. In particular, there are many possibilities for the size, shape and location of each of first and second formations, and for the number of elements that make up each of the first and second formations. More than two formations may be provided, and the mounting member may be located directly on the chip or on the chip package.

A number of discrete variations to the distance may be provided by arranging that a number of orientations of the mounting member provide different distances. For instance, there may be three possible distances. The nominal back focal length may be arranged to be the intermediary distance such that the actual distance 64 can be reduced or increased.

Also, one or more of the formations may comprise an aperture or recess. Some formations may comprise a spacing element that is thicker than other spacing elements, or a recess that is deeper than other recesses.

That which is claimed:

1. A lens assembly for an imaging device comprising an image sensor, the lens assembly comprising:
   a lens for focusing external radiation towards the image sensor;
   a mounting member between the lens and the image sensor so that the lens is spaced a set distance from the image sensor; and
   an adjustment member for discretely varying position of the mounting member relative to the image sensor so that the set distance is varied, with a relative position between the mounting member and the adjustment member remaining unchanged.

2. A lens assembly according to claim 1, wherein the adjustment member comprises a first formation between the mounting member and the image sensor.

3. A lens assembly according to claim 2, wherein the first formation is at the image sensor; and wherein the adjustment member further comprises a second formation at the mounting member.

4. A lens assembly according to claim 3, wherein at least one of the first and second formations comprises a spacing element.

5. A lens assembly according to claim 3, wherein the first formation engages with the second formation when the mounting member is at a first orientation relative to the image sensor; and wherein the first formation does not engage with the second formation when the mounting member is at a second orientation relative to the image sensor.

6. A lens assembly according to claim 1, wherein the adjustment member varies the set distance in one or more discrete steps.

7. A lens assembly according to claim 1, further comprising a lens holder coupled to the mounting member.

8. A device comprising
   an image sensor; and
   a lens assembly for the image sensor, and comprising
      a lens for focusing external radiation towards the image sensor,
      a mounting member between the lens and the image sensor so that the lens is spaced a set distance from the image sensor, and
      an adjustment member for discretely varying position of the mounting member relative to the image sensor so that the set distance is varied, with a relative position between the mounting member and the adjustment member remaining unchanged.

9. A device according to claim 8, wherein the adjustment member comprises a first formation between the mounting member and the image sensor.

10. A device according to claim 9, wherein the first formation is at the image sensor; and wherein the adjustment member further comprises a second formation at the mounting member.

11. A device according to claim 10, wherein at least one of the first and second formations comprises a spacing element.

12. A device according to claim 11, wherein the first formation engages with the second formation when the mounting member is at a first orientation relative to the image sensor; and wherein the first formation does not engage with the second formation when the mounting member is at a second orientation relative to the image sensor.

13. A device according to claim 8, wherein the adjustment member varies the set distance in one or more discrete steps.

14. A device according to claim 8, further comprising a lens holder coupled to the mounting member.

15. A device according to claim 8, wherein the image sensor and the lens assembly are configured so that the device comprises a camera.

16. A method of assembling a lens assembly for an imaging device comprising an image sensor, the method comprising:
   providing a lens for focusing external radiation towards the image sensor;
   positioning a mounting member between the lens and the image sensor so that the lens is spaced from the image sensor by a set distance; and
   discretely adjusting the position of the mounting member relative to the image sensor using an adjustment member so that the set distance is varied, with a relative position between the mounting member and the adjustment member remaining unchanged.

17. A method according to claim 16, wherein the adjustment member comprises at least one formation for interposing the mounting member between the lens and the image sensor.

18. A method according to claim 17, wherein the at least one formation comprises a first formation at the image sensor and a second formation at the mounting member; with the first and second formations cooperating to provide the adjustment member.

19. A method according to claim 18, wherein the first and second formations are arranged so that the first formation engages with the second formation when the mounting member is at a first orientation relative to the image sensor; and the first formation does not engage with the second formation when the mounting member is at a second orientation relative to the image sensor.

20. A method according to claim 16, wherein the adjustment member varies the set distance in one or more discrete steps.

* * * * *